Feb. 17, 1959 J. H. GUYTON ET AL 2,874,233

TRANSISTOR POWER AMPLIFIER

Filed June 14, 1954

INVENTORS
James H. Guyton &
Edward G. Roka
By R. E. Fowler
Attorney

United States Patent Office 2,874,233

Patented Feb. 17, 1959

2,874,233

TRANSISTOR POWER AMPLIFIER

James H. Guyton and Edward G. Roka, Kokomo, Ind., assignors to General Motors Corporation, Detroit, Mich., a corporation of Delaware Application June 14, 1954, Serial No. 436,393

2 Claims. (Cl. 179—171)

This invention relates to power amplifying circuits and more particularly to power amplifying circuits for use in radio apparatus utilizing transistors.

One of the advantages of transistors is that they are operable on low voltages, not requiring the high voltage that their counterparts, the electron tubes, use. For example, a transistor will operate satisfactorily on 12 volts, where an electron tube for a similar use may require as much as 240 volts. In automotive radio equipment this makes the transistor very attractive as the 12 volt battery supply is already available in the car, where an extra vibrator-transformer power pack is necessary to provide higher voltages, such as 240 volts, for electron tubes.

Because transistors are low impedance devices, they are adapted to handle large amounts of power at low voltage. There is, however, one difficulty or drawback to the use of transistors as amplifiers, and that is that they are non-linear response devices. They are particularly poor at high collector currents or high output loads. This non-linearity produces distortion of the amplified signal.

It is an object in making this invention to provide an amplifier circuit utilizing a transistor which will provide satisfactory amplification of applied alternating current signals.

It is a further object in making this invention to provide a transistor power amplifier stage for radio apparatus.

It is a still further object in making this invention to provide a transistor power amplifier stage with degeneration to compensate for distortion produced by non-linear response.

It is a still further object in making this invention to provide a transistor power amplifier stage with adjustable negative feedback to compensate for the non-linear response of the transistor.

With these and other objects in view which will become apparent as the specification proceeds, our invention will be best understood by reference to the following specification and claims and the illustrations in the accompanying drawings, in which:

Figure 1:
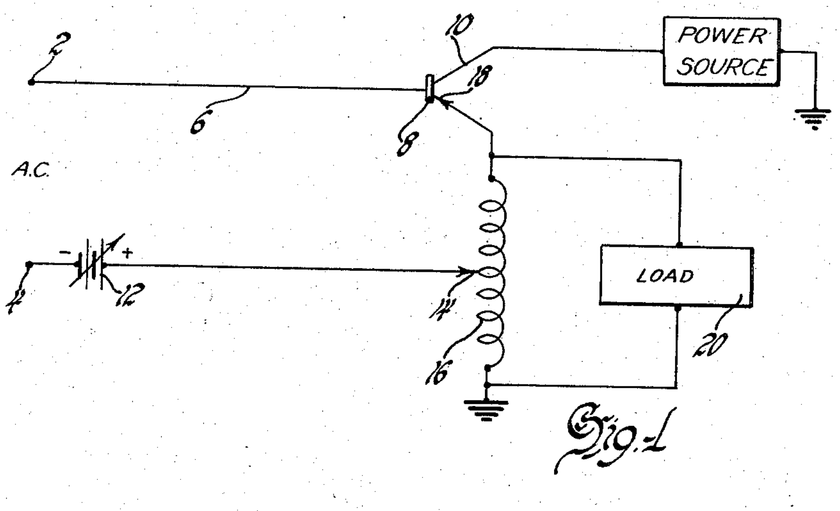
Figure 1 is a circuit diagram of an amplifier stage incorporating the invention.

Referring now more particularly to the circuit diagram of Fiure 1, the input to the stage is connected across terminals 2 and 4 and may be, for example, an audio frequency wave such as that produced by the detector stage of a radio receiver. Terminal 2 is connected by line 6 with the base 8 of a transistor which may be, for example, of the PNP junction type, but may also be of other types. The collector electrode 10 is connected directly to a terminal of one polarity of the power source as indicated. The opposite polarity of the power source is connected to ground as shown.

Terminal 4 is directly connected to one terminal of an adjustable biasing voltage supply 12. The other side of the biasing supply is connected to an adjustable tap 14 on impedance 16, the latter being connected between the emitter electrode 18 and ground. The output of the stage is connected directly across the impedance 16 and is indicated diagrammatically as load 20. The input signal is thus applied across terminals 2—4 and the stage feeds into load 20, which may be, for example, a loud speaker.

Figure 2:
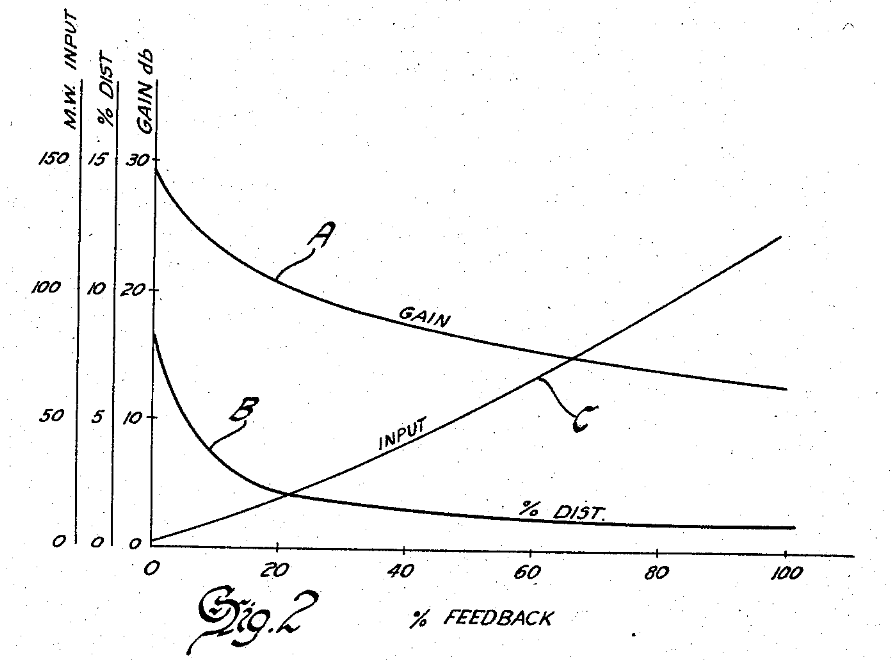
Figure 2 is a composite graph showing the percent feedback plotted individually against the gain, input and distortion in the operation of the amplifier.

Figure 2 shows curves illustrating the operation of the stage. With the tap 14 at the upper end near emitter 18, the circuit has the performance of a grounded emitter circuit, but when it is moved down on impedance 16 to the grounded end, it gradually changes the characteristics of the circuit to perform as a grounded collector circuit. The percentage feedback, of course, varies from 0 to 100 percent during this adjustment. By referring to Figure 2 it will be seen that with the tap 14 at the upper end of the impedance which means zero feedback, the input required will be low, the gain of the stage will be high, and the distortion will also be high. As the tap 14 is moved down on the impedance 16, the curve A of Figure 2 shows that the gain will decrease, falling from approximately 30 decibels in a particular example, to 15. At the same zero tap setting the distortion is relatively high, but falls off as the percentage of feedback is increased, as shown in curve B in Figure 2. Likewise, as the percent feedback is increased, it is, of course, necessary to increase the input and curve C is illustrative of said input.

It will thus be seen that by providing feedback the distortion can be materially reduced without too large a loss in gain or a requirement of excessive input power with our novel amplifier stage. While the tap 14 has been illustrated as variable, it may be a fixed tap within the scope of our invention. If a constant amount of feedback is desired, the tap may be permanently secured to a given point such as in a factory adjustment prior to shipment and sale.

We claim:

1. An audio frequency power amplifier having operating characteristics intermediate those of a common collector configuration and a common emitter configuration and comprising a transistor having emitter, collector, and base electrodes, said transistor having a non-linear relation between base and collector currents within the operating range as a power amplifier, an operating potential circuit applying a positive bias to said collector if the transistor is an NPN type and applying a negative bias thereto if said transistor is a PNP type, said circuit extending between the collector electrode and the emitter electrode and including a serially connected supply voltage source and an inductive impedance connected serially therewith by its end terminals and having a tap intermediate the end terminals, an input circuit including a signal voltage source and a bias voltage source and extending between the base electrode and said tap, said bias voltage source providing a quiescent emitter to base current value for class A operation as a power amplifier, said tap being positioned to determine the portion of said impedance between the emitter electrode and the tap and the amount of negative feedback to the input circuit whereby a compromise is established between driving power and amplifier distortion and gain, and a load device connected across the end terminals of said inductive impedance.

2. An amplifier for audio frequency signal voltages comprising a transistor having a base, an emitter and a collector, an inductive impedance connected between said emitter and ground, a variable tap on said impedance, an output circuit including a load device connected across said impedance, a supply voltage source connected between the collector of the transistor and ground, said supply voltage source applying a positive bias to said collector if said collector is of the NPN type and a negative bias thereto if said transistor is a PNP type, an input circuit including a signal voltage source and a bias voltage source connected across said base and tap, whereby the position of the tap determines the portion of said impedance between the emitter and the tap and the amount of feedback from the output circuit to the input circuit may be adjusted to establish a compromise between driving power and amplifier gain and distortion.

References Cited in the file of this patent

UNITED STATES PATENTS

| | | |
|---|---|---|
| 2,485,665 | Shepherd | Oct. 15, 1949 |
| 2,598,326 | White et al. | May 27, 1952 |
| 2,662,122 | Ryder | Dec. 8, 1953 |
| 2,662,124 | McMillan | Dec. 8, 1953 |
| 2,663,766 | Meacham | Dec. 27, 1953 |
| 2,691,077 | Koros | Oct. 5, 1954 |

OTHER REFERENCES

Shea text, "Principles of Transistor Circuits," pages 349–350, pub. 1953 by John Wiley & Sons, New York. (Copy in Div. 69.)